United States Patent [19]
Shou et al.

[11] Patent Number: 5,793,321
[45] Date of Patent: Aug. 11, 1998

[54] A/D CONVERTING CIRCUIT WITH QUANTIZERS AND INVERTED AMPLIFIERS

[75] Inventors: Guoliang Shou; Kazunori Motohashi; Makoto Yamamoto; Sunao Takatori, all of Tokyo, Japan

[73] Assignees: Sharp Kabushiki Kaisha, Osaka; Yozan, Inc., Tokyo, both of Japan

[21] Appl. No.: 764,638

[22] Filed: Dec. 11, 1996

[30] Foreign Application Priority Data

Dec. 12, 1995  [JP]  Japan ............... 7-346336

[51] Int. Cl.$^6$ ....................... H03F 3/46
[52] U.S. Cl. ............... 341/155; 327/60; 341/200
[58] Field of Search ............... 341/155, 156, 341/172, 163, 200; 327/75; 326/60

[56] References Cited

U.S. PATENT DOCUMENTS

| | | | |
|---|---|---|---|
| 5,600,270 | 2/1997 | Shou et al. | 327/75 |
| 5,631,941 | 5/1997 | Shou et al. | 377/75 |

*Primary Examiner*—Brian K. Young
*Assistant Examiner*—Peguy JeanPierre
*Attorney, Agent, or Firm*—Cushman Darby & Cushman IP Group of Pillsbury Madison & Sutro LLP

[57] ABSTRACT

An A/D converting circuit for realizing a stable performance without being influenced by variations in characteristic values of each inverter. The A/D converting circuit includes a quantizing inverter which is constructed by a number of unit inverters parallelly connected.

4 Claims, 9 Drawing Sheets

A/D CONVERTING CIRCUIT WITH QUANTIZERS AND INVERTED AMPLIFIERS

FIELD OF THE INVENTION

The present invention relates to an A/D converting circuit. More specifically, the present invention is related to an A/D converting circuit comprising at least two quantizing circuits and a plurality of inverted amplifiers with feedback capacitors.

BACKGROUND OF THE INVENTION

The inventors propose A/D converting circuits with high degrees of accuracy regardless of variations in capacitances. Japanese patent applications 6-261613 and 7-263574 show A/D converting circuits. However, in those AID converting circuits, a threshold of an MOS inverter for quantization is influenced by the accuracy of circuit elements. Therefore, it has been necessary to control the accuracy of the circuit elements.

SUMMARY OF THE INVENTION

The present invention solves the above conventional problems and has an object to provide an A/D converting circuit for realizing a stable performance without being influenced by variations in characteristic values of each inverter.

In an A/D converting circuit according to the present invention, a quantizing inverter is constructed by a plurality of unit inverters parallelly connected in order to achieve the above object.

The A/D converting circuit of the present invention comprises a first capacitance to which an analog input voltage is input; a first inverted amplifying portion connected to an output of the first capacitance, having a range of linearity; and a first quantizing circuit to which the analog input voltage is input and from which a quantized output of the analog input voltage is output. The A/D converting circuit also includes a capacitive coupling for output, to which outputs of the first inverted amplifying portion and the quantizing circuit are input; a second inverted amplifying portion to which an output of the capacitive coupling for output is input, having substantially the same characteristics as the first inverted amplifying portion; and a second quantizing circuit to which an output of the second inverted amplifying portion is input, for quantizing an output of the second inverted amplifying portion.

The quantizing circuits consist of a plurality of thresholding circuits with quantizing MOS inverters and capacitive coupling. The capacitive coupling adds the analog input voltage and inverted outputs from the thresholding circuits of higher threshold. The MOS inverter outputs a low level voltage when the addition result exceeds the threshold of MOS inverter.

PREFERRED EMBODIMENT OF THE PRESENT INVENTION

A preferred embodiment of an A/D converting circuit according to the present invention is described with reference to the attached drawings.

Figure 1:
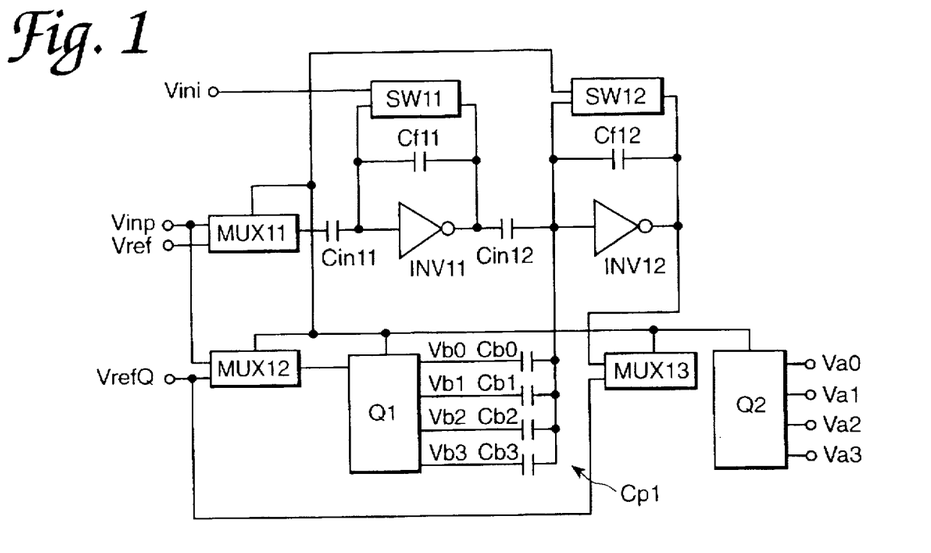
FIG. 1 shows an embodiment of AID converting circuit of the present invention.

In FIG. 1, an A/D converting circuit is illustrated. The A/D converting circuit includes two stages of inverters INV11 and INV12, to which feedback capacitances Cf11 and Cf12 are connected, respectively, for feeding back the outputs of the inverters to corresponding inputs. An input capacitance Cin11 is connected to an input terminal of INV11, and an analog input voltage Vinp is input to the Cin11 through MUX11. An input capacitance Cin12 is connected to an input terminal of the INV12, to which an output of INV11 is connected through Cin12.

Each of INV11 and INV12, consisting of three stages of MOS inverters, has a large gain due to multiplication of open gains of the three inverters. INV11 generates an output V1 which is equal to a ratio of the input capacitance to the feedback capacitance with good linearity as below.

$$V1 = Vdd[AMP] - \frac{Cin11}{Cf11} Vinp \tag{1}$$

In equation (1), Vdd[AMP] is equal to a supply voltage of INV11 and INV12.

The input voltage Vinp is input to MUX11 and MUX12, and Vinp is input to the first quantizing circuit Q1 through MUX12. An output of Q1 is input to INV12 through a capacitive coupling Cp1. The quantizing circuit Q1 converts the Vinp into a binary digit with a plurality of bits (4 bits, in this embodiment), and the output voltage Vb0, Vb1, Vb2 and Vb3 are integrated by the capacitive coupling Cp1.

The capacitive coupling Cp1 consists of capacitances Cb0, Cb1, Cb2 and Cb3. The outputs of Q1, Vb0 t Vb3, are input to the Cb0 to Cb3, respectively. Outputs of Cp1 and Cin12 are parallelly input to INV12. Assuming that input and output voltages of INV12 to be V2 and Vo, respectively, the relationship in equation (2) is true.

$$Cf12(V0 - V2) = -\left\{ (V1 - V2)Cin12 + \sum_{i=0}^{3} (Vbi - V2)Cbi \right\} \tag{2}$$

The ratio of each capacitance is settled as below.

$$Cin11:Cf11=1:1 \tag{3-1}$$

$$Cin12:Cf12:Cb0:Cb1:Cb2:Cb3=16:1:8:4:2:1 \tag{3-2}$$

From equations (2), (3-1) and (3-2), equation (4) for calculating Vo is obtained.

$$Vo = 16 \left\{ Vinp - \sum_{i=0}^{3} \frac{2^{(3-i)}Vbi}{16} \right\} \quad (4)$$

The result in equation (4) illustrates that the value converted into the binary data of 4 bits from Vinp is subtracted from Vinp itself. The output of the quantizing circuit Q1 is the upper 4 bits data and Vo is the lower data. The Vo is input to the second quantizing circuit Q2, in which the second stage of binarization of 4 bits is performed. Q2 outputs binarized voltage of Va0, Va1, Va2 and Va3. These are the lower 4 bits data of Vinp.

Figure 2:
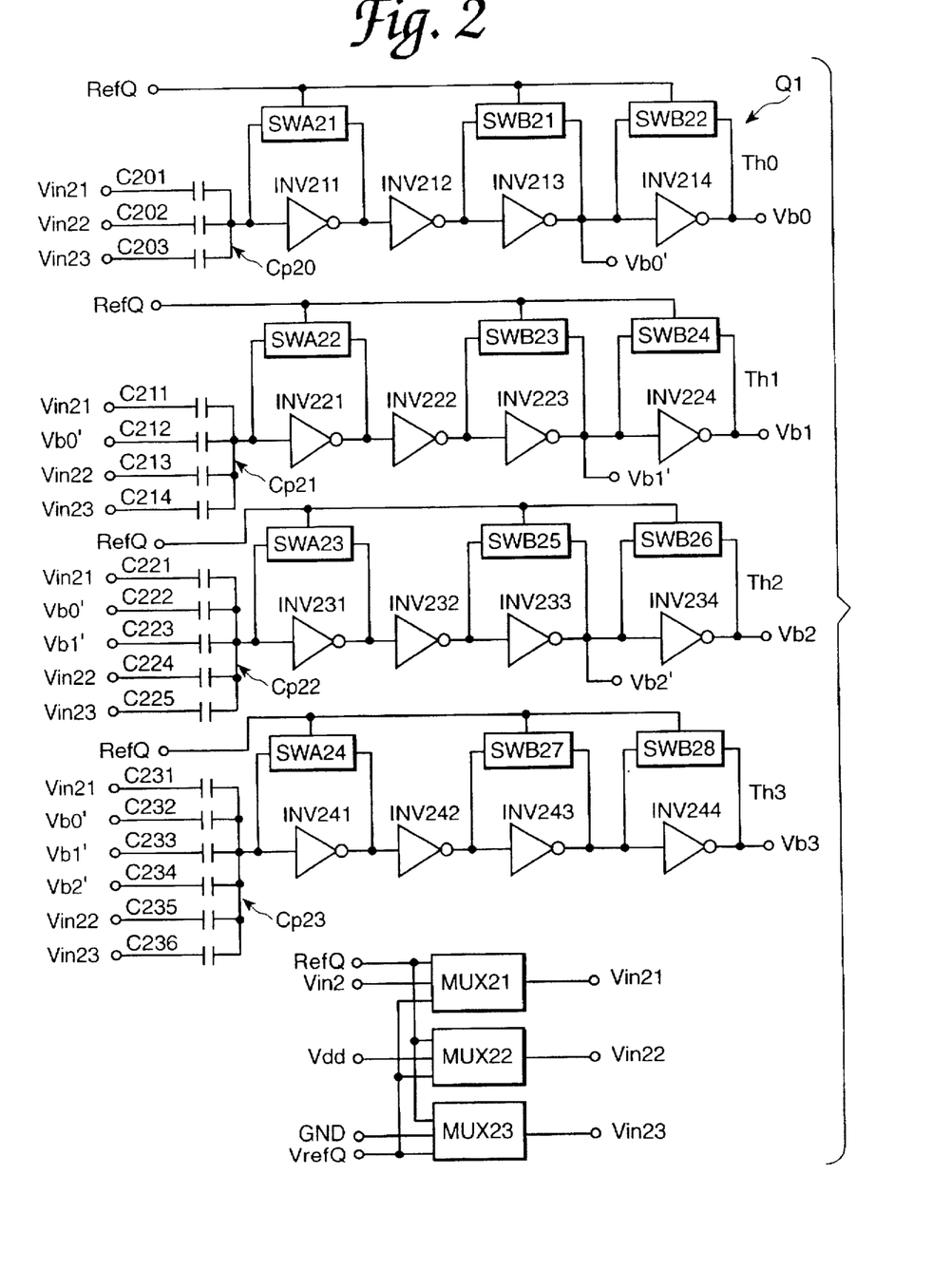
FIG. 2 shows a quantizing circuit of the embodiment.

In FIG. 2, the quantizing circuit Q1 consists of thresholding circuits Th0, Th1, Th2 and Th3. The output voltages Vb0 to Vb3 are generated as outputs of these thresholding circuits. Inverted voltages Vb0' to Vb3' of respective Vb0 to Vb3 are generated as intermediate data. An input to the quantizing circuit Q1 is generated in multiplexers MUX21, MUX22 and MUX23. The MUX21 generates Vin21 by selectively outputting input voltage Vin2 and the reference voltage VrefQ, and MUX22 generates Vin22 by selectively outputting a supply voltage Vdd and the reference voltage VrefQ. MUX23 generates Vin23 by selectively outputting a ground GND and the reference voltage VrefQ.

To the uppermost thresholding circuit Th0, Vin21, Vin22 and Vin23 are input. To the secondary thresholding circuit Th1, Vin21 and Vin23 and Vb0 are input. To the third thresholding circuit Th2, Vin21 to Vin23, Vb0' and Vb1 are input. To the fourth thresholding circuit Th3, Vin21 to Vin23, Vb0', Vb1' and Vb2' are input.

The thresholding circuit Th3 consists of a capacitive coupling Cp23 and four stages of quantizing MOS inverters INV241, INV242, INV243 and INV244. The capacitive coupling Cp23 consists of C231, C232, C233, C234, C235 and C236 which are connected with Vin21, b0', b1', b2', Vin22 and Vin23, respectively.

The thresholding circuit Th2 consists of a capacitive coupling Cp22 and four stages of quantizing MOS inverters INV231, INV232, INV233 and INV234. The capacitive coupling Cp22 consists of capacitances C221, C222, C223, C224 and C225 which are connected with Vin21, b0', b1', Vin22 and Vin23, respectively.

The thresholding circuit Th1 consists of a capacitive coupling Cp21 and four stages of quantizing MOS inverters INV221, INV222, INV223 and INV224. The capacitive coupling Cp21 consists of capacitances C211, C212, C213 and C214 which are connected with Vin21, b0', Vin22 and Vin23, respectively.

The thresholding circuit Th0 consists of a capacitive coupling Cp20 and four stages of quantizing MOS inverters INV211, INV212, INV213 and INV214. The capacitive coupling Cp20 consists of capacitances C201, C202 and C203 which are connected with Vin21, Vin22 and Vin23, respectively.

The capacitance ratio of each the capacitance coupling is shown in TABLE 1. The changes in Vb0 to Vb3 when Vin21 change from 0 to Vdd|V| are shown in TABLE 2. In TABLE 1, Cu is a proportional constant. In TABLE 2, Va is equal to Vdd/16.

TABLE 1

| CAPACITY OF CAPACITANCES | | |
|---|---|---|
| CAPACITIVE COUPLING | CAPACITANCE | CAPACITY |
| CP20 | C201 | 16 Cu |
|  | C202 | 8 Cu |
|  | C203 | 8 Cu |
| CP21 | C211 | 16 Cu |
|  | C212 | 8 Cu |
|  | C213 | 4 Cu |
|  | C214 | 4 Cu |
| CP22 | C221 | 16 Cu |
|  | C222 | 8 Cu |
|  | C223 | 4 Cu |
|  | C224 | 2 Cu |
|  | C225 | 2 Cu |
| CP23 | C231 | 16 Cu |
|  | C232 | 8 Cu |
|  | C233 | 4 Cu |
|  | C234 | 2 Cu |
|  | C235 | 1 Cu |
|  | C236 | 1 Cu |

TABLE 2

| INPUT AND OUTPUT OF A/D CONVERTING CIRCUIT | | | | | | | | |
|---|---|---|---|---|---|---|---|---|
| ANALOG INPUT VOLTAGE | INNER INTERMEDIATE OUTPUT | | | | OUTPUT VOLTAGE | | | |
| Vinp | Vb3' | Vb2' | Vb1' | Vb0' | Vb3 | Vb2 | Vb1 | Vb0 |
| 0 ≦ Vinp < Va | Vdd | Vdd | Vdd | Vdd | 0 | 0 | 0 | 0 |
| Va ≦ Vinp < 2Va | 0 | Vdd | Vdd | Vdd | 1 | 0 | 0 | 0 |
| 2Va ≦ Vinp < 3Va | Vdd | 0 | Vdd | Vdd | 0 | 1 | 0 | 0 |
| 3Va ≦ Vinp < 4Va | 0 | 0 | Vdd | Vdd | 1 | 1 | 0 | 0 |
| 4Va ≦ Vinp < 5Va | Vdd | Vdd | 0 | Vdd | 0 | 0 | 1 | 0 |
| 5Va ≦ Vinp < 6Va | 0 | Vdd | 0 | Vdd | 1 | 0 | 1 | 0 |
| 6Va ≦ Vinp < 7Va | Vdd | 0 | 0 | Vdd | 0 | 1 | 1 | 0 |
| 7Va ≦ Vinp < 8Va | 0 | 0 | 0 | Vdd | 1 | 1 | 1 | 0 |
| 8Va ≦ Vinp < 9Va | Vdd | Vdd | Vdd | 0 | 0 | 0 | 0 | 1 |
| 9Va ≦ Vinp < 10Va | 0 | Vdd | Vdd | 0 | 1 | 0 | 0 | 1 |
| 10Va ≦ Vinp < 11Va | Vdd | 0 | Vdd | 0 | 0 | 1 | 0 | 1 |
| 11Va ≦ Vinp < 12Va | 0 | 0 | Vdd | 0 | 1 | 1 | 0 | 1 |
| 12Va ≦ Vinp < 13Va | Vdd | Vdd | 0 | 0 | 0 | 0 | 1 | 1 |

TABLE 2-continued

INPUT AND OUTPUT OF A/D CONVERTING CIRCUIT

| ANALOG INPUT VOLTAGE | INNER INTERMEDIATE OUTPUT | | | | OUTPUT VOLTAGE | | | |
|---|---|---|---|---|---|---|---|---|
| Vinp | Vb3' | Vb2' | Vb1' | Vb0' | Vb3 | Vb2 | Vb1 | Vb0 |
| 13Va ≦ Vinp < 14Va | 0 | Vdd | 0 | 0 | 1 | 0 | 1 | 1 |
| 14Va ≦ Vinp < 15Va | Vdd | 0 | 0 | 0 | 0 | 1 | 1 | 1 |
| 15Va ≦ Vinp < 16Va | 0 | 0 | 0 | 0 | 1 | 1 | 1 | 1 |

Outputs Vb0 to Vb3 are generated by quantizing circuit Q1 as described above. Since the structure of Q2 is similar to the structure of Q1, the description of Q2 is omitted. As the lower 4 bits are generated in the Q2 in the following stage, the accuracy of the output is improved by 16 times when compared to the case where the quantizing circuit has only one stage of quantization, e.g., Q1. When the quantizing circuit has more stages, more accurate digital output is generated.

As is clear from TABLE 1, the total value of the capacity of each capacitive coupling is constant at 32Cu. The influence of parasitic capacity of inverters INV211 to INV214, INV221 to INV224, INV231 to INV234 and INV241 to INV244 can be substantially reduced. Assuming that the parasitic capacity of an inverter of supply voltage is Cpa1, that of ground is Cpa2 and that of output is Cpa3, the capacities of capacitances of capacitive couplings connected to the inverter are W1 to Wn, input voltages to the capacitances are V1 to Vn, and an input voltage of an inverter is Va, equation (5) is true considering the parasitic capacities are extremely small comparing with W1 to Wn.

$$VA = \frac{\sum_{i=1}^{n} WiVi + Cpa1Vdd + Cpa2 \times 0 + Cpa3 \times 0}{\sum_{i=1}^{n} Wi + Cpa1 + Cpa2 + Cpa3} \cong \tag{5}$$

$$\frac{W1V1 + \sum_{i=2}^{n} WiVdd}{\sum_{i=1}^{n} Wi + Cpa1 + Cpa2 + Cpa3}$$

As the parasitic capacity is approximately constant, the influence of the parasitic capacity of the VA can be ignored when the total capacity of the capacitive coupling is constant.

As described above, the A/D converting circuit performs highly accurate A/D conversion by including two stages of quantizing circuits Q1 and Q2. In the present embodiment, it is possible to cancel the offset of inverters INV211, INV221, INV231, INV241 in the quantizing circuits Q1 and Q2. The range of the quantizing circuit is within the linear area of INV11 and INV12.

First, in order to cancel an offset, the reference voltage VrefQ accurately generated outside of the LSI is input to each thresholding circuit when a refreshment is performed. Inputs and outputs of respective inverters INV211, INV213, INV214, INV221, INV223, INV224, INV231, INV233, INV234, INV241, INV243 and INV244 are connected each other by switches SWA21, SWB21, SWB22, SWA22, SWB23, SWB24, SWA23, SWB25, SWB26, SWA24, SWB27 and SWB28, respectively. When a refreshment is performed, the inputs are short-circuited to corresponding outputs by the switches.

When it is assumed that the thresholding voltage of each inverter is Vth, the electric charge 10 generated in each capacitive coupling on refreshment is as formulated in equation (6).

$$q0 = 32Cu(VrefQ - Vth) \tag{6}$$

When it is assumed that the thresholds as thresholding circuits whose outputs are inverted by thresholding circuits Th0 to Th3 are Vth0, Vth1, Vth2 and Vth3, respectively, the thresholds are calculated as below.

$$Vth0 = \frac{1}{16Cu}(-8Cu \cdot Vdd + 32Cu \cdot Vth + q0) \tag{7}$$

$$Vth1 = \frac{1}{16Cu}(-8Cu \cdot Vb0 - 4Cu \cdot Vdd + 32Cu \cdot Vth + q0) \tag{8}$$

$$Vth2 = \frac{1}{16Cu}(-8Cu \cdot Vb1 - 4Cu \cdot Vb0 - 2Cu \cdot Vdd + 32Cu \cdot Vth + q0) \tag{9}$$

$$Vth3 = \frac{1}{16Cu}(-8Cu \cdot Vb2 - 4Cu \cdot Vb1 - 2Cu \cdot Vb0 - Cu \cdot Vdd + 32Cu \cdot Vth + q0) \tag{10}$$

Substituting equation (6) for q0 in equation (7), VrefQ can be obtained by equation (11). Here Vth is canceled. It means that the variance of Vth, that is, offset is canceled.

$$VrefQ = \frac{2Vth0 + Vdd}{4} \tag{11}$$

For example, when Vth0 should be 2.5[V], VrefQ=2.0[V] assuming Vdd=3.0[V], Vth=2.5[V] in other thresholding circuits.

Inverters INV11 and INV12 are connected by switches SW11 and SW12 for short-circuiting the inputs and outputs. When the refreshment is performed, these switches are closed and the reference voltage Vref is input to Cin11 by multiplexer MUX11. Generally, corresponding to an input voltage Vimp, it is assumed that an electric charge q1 is generated in the capacitance Cin11, an electric charge q2 is generated in the capacitive coupling Cp1, an input voltage of INV11 and INV12 is Vb, an output voltage of INV11 is Vn, and an output voltage INV12 is Vout, equations (12) and (13) below are obtained.

$$q1 = Cu(Vn-Vb) + Cu(Vinp-Vb) \tag{12}$$

$$q2 = \{(Vout-Vb) + 16(Vn-Vb) + 8(Vb0-Vb) + 4(Vb1-Vb) + 2(Vb2-Vb) + (Vb3-Vb)\}Cu \tag{13}$$

From equations (12) and (13), Vn is deleted and Vout is calculated.

$$Vout = 16Vinp - 8Vb0 - 4Vb1 - 2Vb2 - Vb3 - \frac{16q1}{Cu} + \frac{q2}{Cu} \tag{14}$$

Offset Vx is intentionally provided to the input voltage and the inverter is set from a little higher voltage then 0[V] as the range of action. Using the Vx, equation (14) can be rewritten into equation (15).

$$Vout = 16(Vinp) - Vx) - 8Vb0 - 4Vb1 - 2Vb2 - Vb3 - \frac{16q1}{Cu} + \quad (15)$$

$$\frac{q2}{Cu} + 16Vx$$

The three terms of right side of the equation (15) are shift voltage Vsft which is an offset of the range of action of output voltage Vout. The Vsft is as in equation (16).

$$Vsft = \frac{16q1}{Cu} + \frac{q2}{Cu} + 16Vx \quad (16)$$

When the supply voltages of INV11 and INV12 are 5.0 V which is higher than Vdd of the supply voltage of the inverter of the quantizing circuit, equations (17) and (18) are true when a refreshment is performed.

$$Cu(Vref-Vb)=q1 \quad (17)$$

$$15Cu(Vth-Vb)=q2 \quad (18)$$

Substituting equations (17) and (18) for q1 and q2 in equation (16), equation (19) can be obtained for calculating Vref.

$$Vref = \frac{1}{16}(15Vth + Vb + 16Vx - Vsft) \quad (19)$$

It is possible to settle that the all of input voltage Vinp is within the linear area of INV11 and INV12 by setting the supply voltage of INV11 and INV12 higher than the supply voltage of inverters of Q1 and Q2, and by providing Vx. The accuracy of A/D conversion can be improved by it. For example, the range of input voltage is settled from 1.0 to 4.0[V], and Vx=1.0[V] according to it. In equation (11), the thresholds of the thresholding circuits Th0 to Th3 are settled to 2.5[V] which is 1.0[v] higher than Vth corresponding to the upper limit of action range is settled 4.0[V] which is 1.0[V] higher than the Vdd. Vb=2.5[V], Vth=1.5[V]. Vsft is assumed to be 1.0[V]. Substituting them to equation (19), Vref=2.5[V].

It is possible to improve the accuracy of A/D conversion by settling the operating range to be within the linear area.

Figure 3:
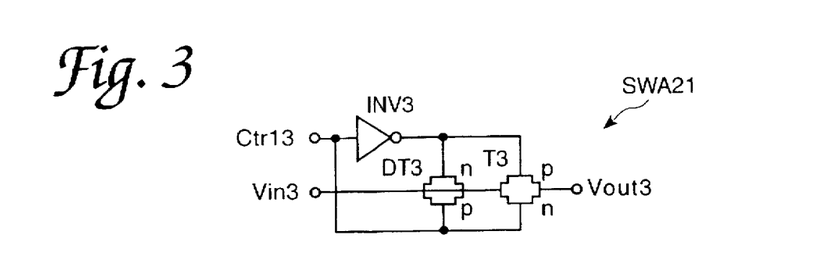
FIG. 3 shows a circuit of the second switch in the embodiment.

As shown in FIG. 3, the switch SWA21 has a transistor circuit T3 including a pMOS transistor and a nMOS transistor parallelly connected to an input voltage Vin3. The pMOS and nMOS are connected so that their sources are connected to the drain of the other. Input voltage Vin3 is connected to the drain of pMOS (source of nMOS). A dummy transistor DT3 is connected to the input of the transistor circuit T3. In DT3, nMOS and pMOS are connected with each other with inverse polarity of T3 and their inputs and outputs are short-circuited. A control signal Ctrl13 and its inverse signal, inverted by an inverter INV3, are input to the gates of nMOS and pMOS of T3, respectively. With respect to DT3, Ctrl3 and its inverse signal are input to gates of pMOS and nMOS, respectively. This is a well-known MOS switch, which outputs Vin3 as an output voltage Vout3 or cuts off with canceling an offset of the input. Since switches SWA22, SWA23, SWA24, SW11 and SW12 are similarly structured to the structure of SWA21, descriptions of the switches are omitted.

Figure 4:
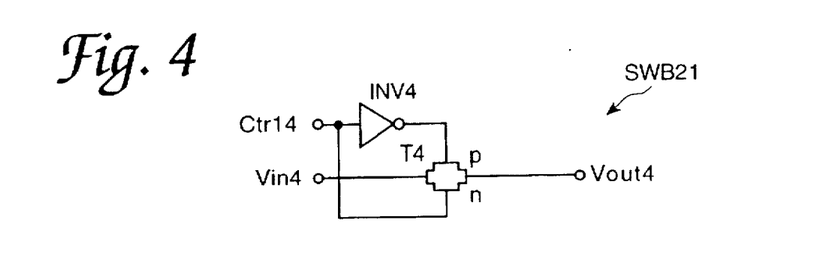
FIG. 4 shows a circuit of the second switch in the embodiment.

In FIG. 4, a switch SWB21 has structure in which the dummy transistor is omitted from the structure of the MOS switch in FIG. 3. It includes a transistor circuit T4 and an inverter INV4. This switch outputs an input voltage Vin4 as an output voltage Vout4 or cuts off according to a control signal by a control circuit Ctrl4. Since other switches SWB22, SWB23, SWB24 SWB26, SWB27 and SWB28 are similarly structured to the structure of SWB21, the descriptions of the other switches are omitted.

Figure 5:
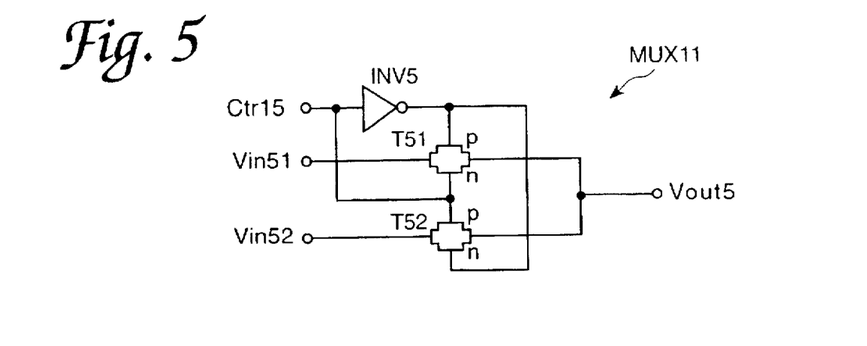
FIG. 5 shows a circuit of a multiplexer in the embodiment.

In FIG. 5, a multiplexer MUX11 consists of a pair of transistor circuits T51 and T52 including pMOS transistor and nMOS transistor parallelly connected to an input voltage Vin5. In T51 and T52, pMOS and nMOS are connected with each other so that their sources are connected to the drains of the other. An input voltage Vin51 is connected to the drain of pMOS (source of nMOS). A control signal Ctrl5 is input to the gates of nMOS of T51 and pMOS, and an inverse signal of Ctrl5, inverted by an inverter INV5, is input to gates of pMOS of T51 and nMOS of T52. This is also well-known MOS switch for outputting Vin5 as an output voltage Vout5 or cutting off the output. Since other multiplexers MUX12, MUX21, MUX22 and MUX23 are similarly structured with MUX1, the descriptions of the other multiplexers are omitted.

Hereinafter, an embodiment of a quantizing inverter is described.

Figure 6:
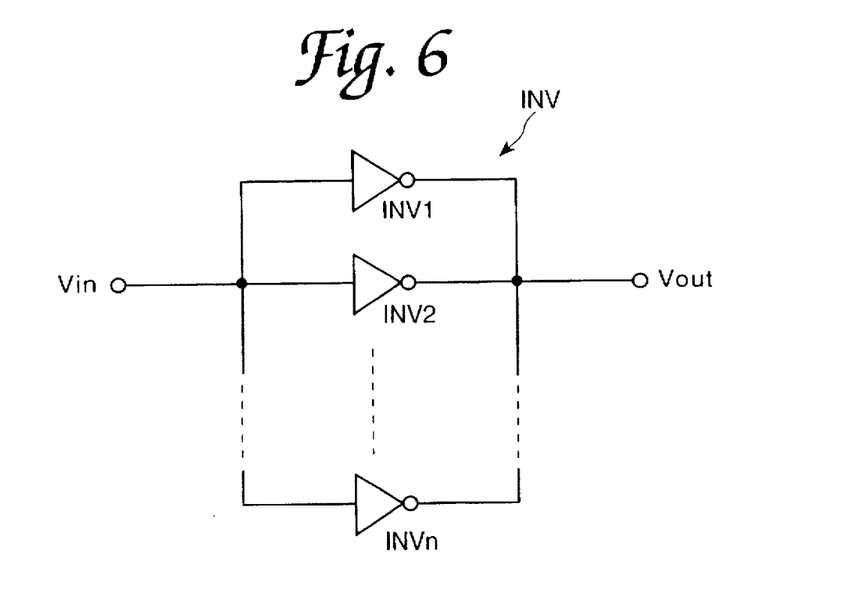
FIG. 6 shows a circuit of an embodiment in an inverter circuit according to the present invention.

As shown in FIG. 6, a quantizing inverter includes a plurality of inverters INV1, INV2, . . . , and INVn parallelly connected between an input terminal Vin and an output terminal Vout.

Figure 7:
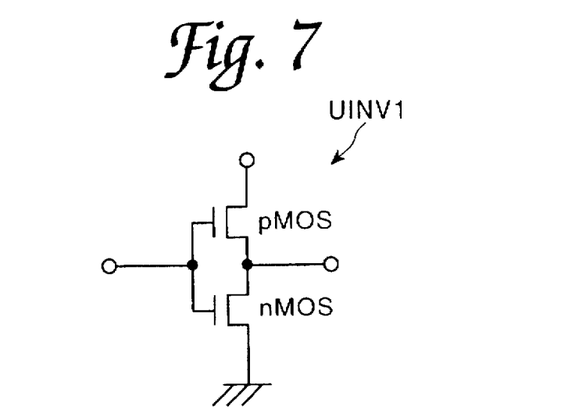
FIG. 7 shows a circuit of a unit inverter in the circuit in FIG. 6.

Each unit inverter is a CMOS inverter in which pMOS FET and nMOS FET are serially connected as shown in FIG. 7. A threshold voltage Vin of a single CMOS inverter is expressed by equation (20), assuming a source voltage impressed to pMOS FET Vpp, a thresholding voltage of pMOS FET is Vtp, and a threshold voltage of nMOS FET is Vtn. When a number of inverters are parallelly connected, the threshold voltage Vth is expressed by equation (21) below.

$$Vth = \frac{V_{DD} + V_{tp} + V_{tn}\sqrt{\frac{\beta n}{\beta p}}}{1 + \sqrt{\frac{\beta n}{\beta p}}} \quad (20)$$

$$\Sigma \beta pi(Vth - V_{DD} - Vtipi)^2 = \Sigma \beta ni(Vth - Vtini)^2 \quad (21)$$

βp and βn are coefficients shown in equations (22) and (23) below, assuming that the mobilities of electrons of pMOS type FET and nMOS type FET are μp and μm, respectively, the permittivity and thickness of a oxidized film of a gate per unit area are ε and tox, respectively, the widths of channels of pMOS type and nMOS type FETs are Wp and Wn, respectively, and the length of channels of them are Lp and Ln.

$$\beta p = \frac{\mu p \epsilon}{tox} \cdot \frac{Wp}{Lp} \quad (22)$$

$$\beta n = \frac{\mu p \epsilon}{tox} \cdot \frac{Wn}{Ln} \quad (23)$$

Though the dispersion of thresholds appears as a normal distribution according to the value of β, the equation (21) cannot be analytically solved because two terms of β are included in the equation (3). As it is conventionally known that the function improves when bipolar transistors are parallelly connected. Generally, it can be expected that a statistically stable function is realized by averaging the characteristics of elements when they are parallelly connected.

The expectation is confirmed by experiments. According to a simulating experimentation, the variance V1 (Vin) of the threshold voltage Vin expressed by equation (20) is larger than the variance V2 (Vin) of the threshold voltage Vin expressed in equation (21).

Figure 8:
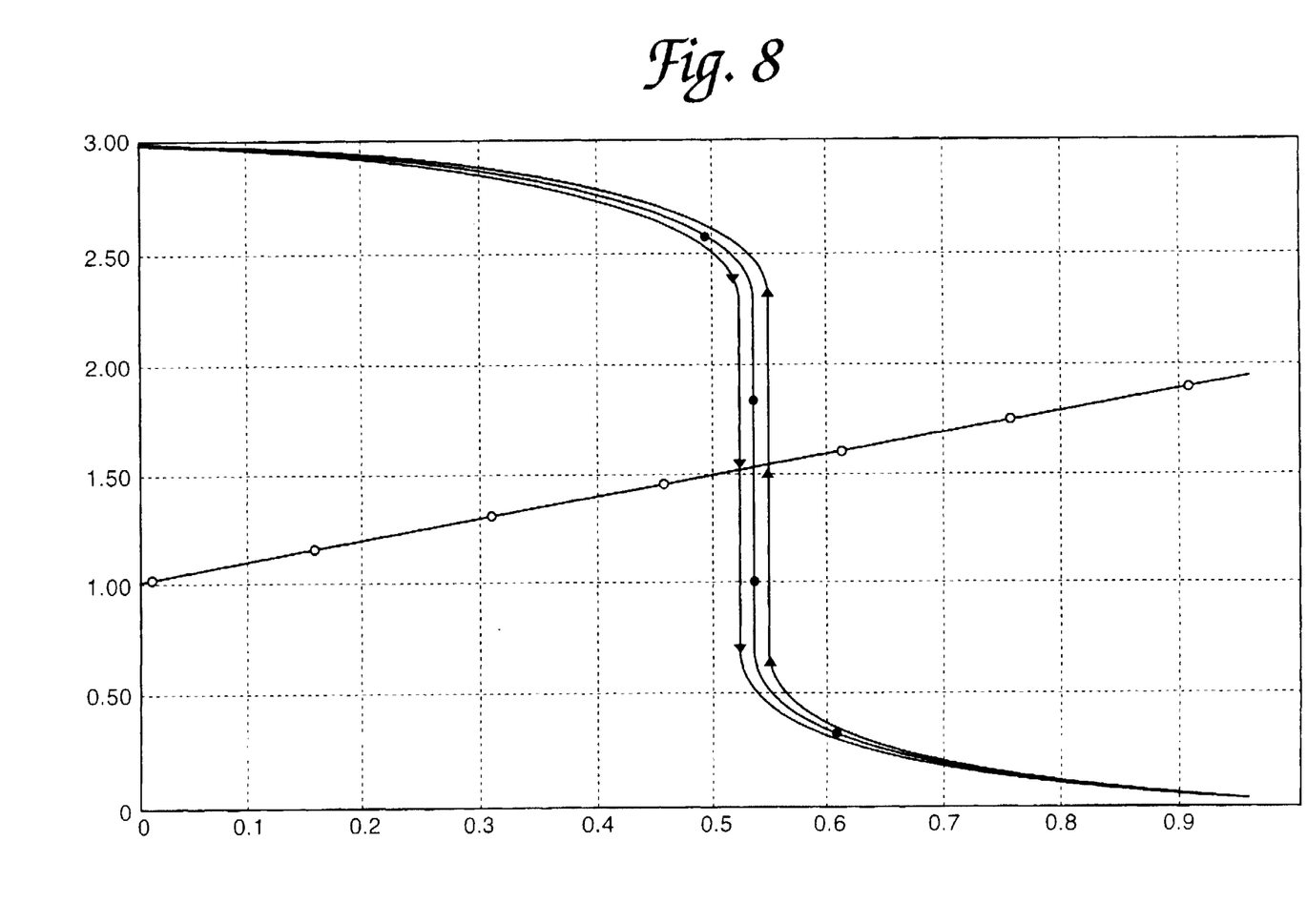
FIG. 8 is a graph showing the characteristics of voltage of two unit inverters and the characteristics of voltage of an inverter circuit parallelly connected to them.

FIG. 8 shows a graph of the characteristics of a voltage of an inverter circuit to which two unit inverters are parallelly connected. In the graph, the line designated with □—□ shows the voltage impressed to the input terminal Vin, the lines designated with △—△ and ▽—▽ show the characteristics of each unit inverter, and the line designated with ○—○ shows the characteristics of inverter circuit parallelly connected to unit inverters.

As shown in FIG. 8, a uniformed the characteristics of inverters can be obtained by parallelly connecting two unit inverters. The case where the unit inverters are three or more is similar to it. Therefore, it is possible to statistically improve the accuracy of threshold by parallelly connecting a plurality of unit inverters.

Figure 9:
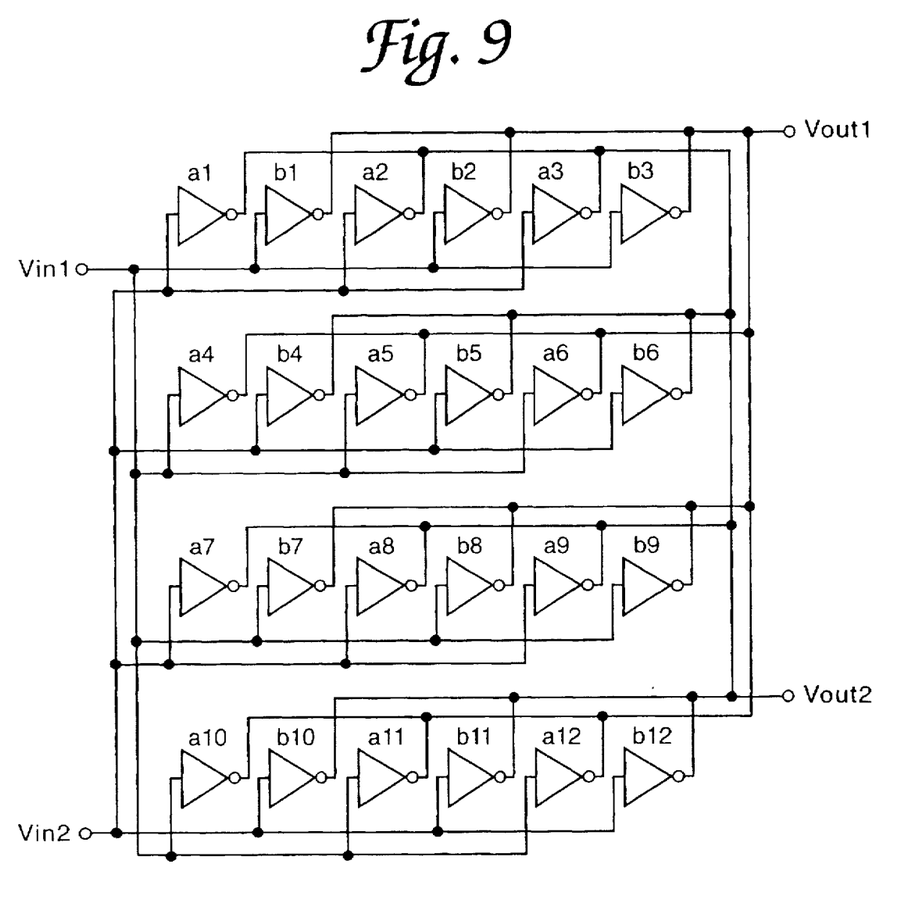
FIG. 9 shows a ground plan of a circuit of an arrangement of unit inverters for two inverter circuits.
Figure 10:
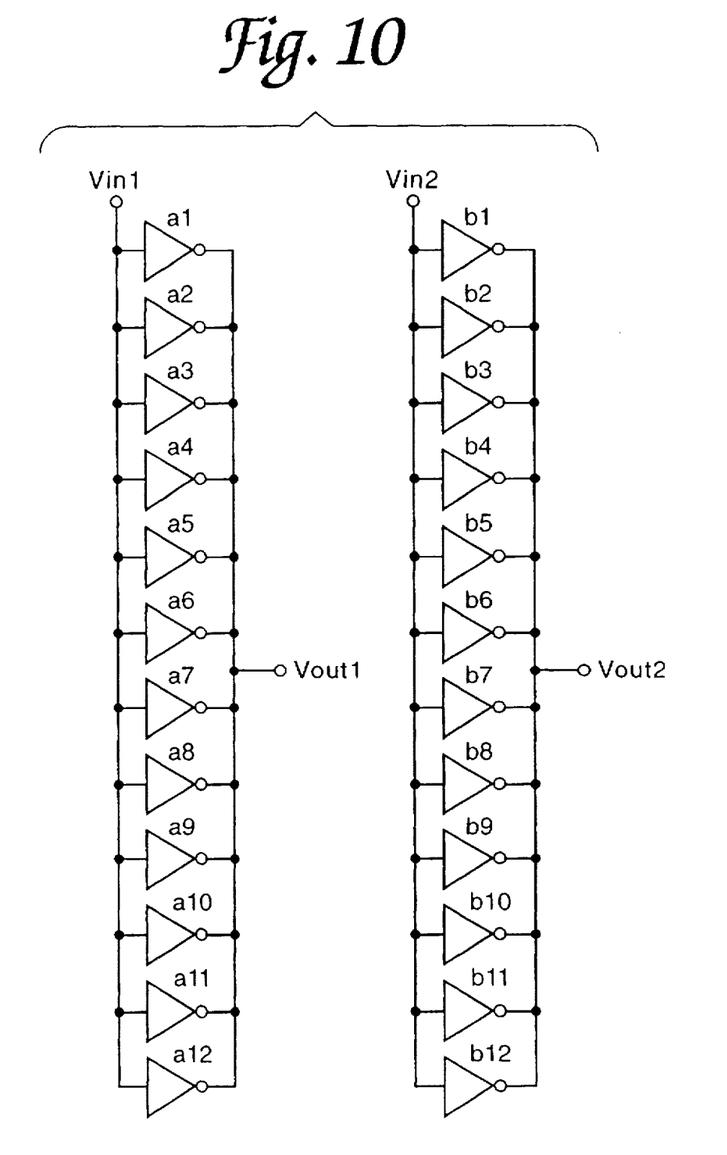
FIG. 10 shows an equivalent circuit in the circuit in FIG. 9.

FIG. 9 shows an arrangement of unit inverters for constructing two inverter circuits using a plurality of unit inverters of two groups. FIG. 10 shows an equivalent circuit to FIG. 9 in order to clarify each inverter circuits. Each inverter circuit includes 12 unit inverters from a1 to a12 and from b1 to b12 parallelly connected. Input and output terminals of a1 to a12 are connected to Vin1 and Vout1, respectively, and input and output terminals of b1 to b12 are connected to Vin2 and Vout2, respectively.

In the arrangement depicted in FIG. 9, the unit inverters of one inverter circuit and those of another inverter circuit are aligned alternately. Therefore, the corresponding unit inverters of both inverter circuit, for example, a1 and b1, and a2 and b2 are adjacently arranged. Generally, elements made up by the same pattern and adjacently arranged have substantially the same characteristics in an LSI, so these pair of unit inverters have substantially the same characteristics. The characteristics of the first and second inverter circuits are closely approximated by parallelly connecting such unit inverters of similar characteristics. Also, the variance disappears, and the error compared with a designed value becomes small.

Figure 11:
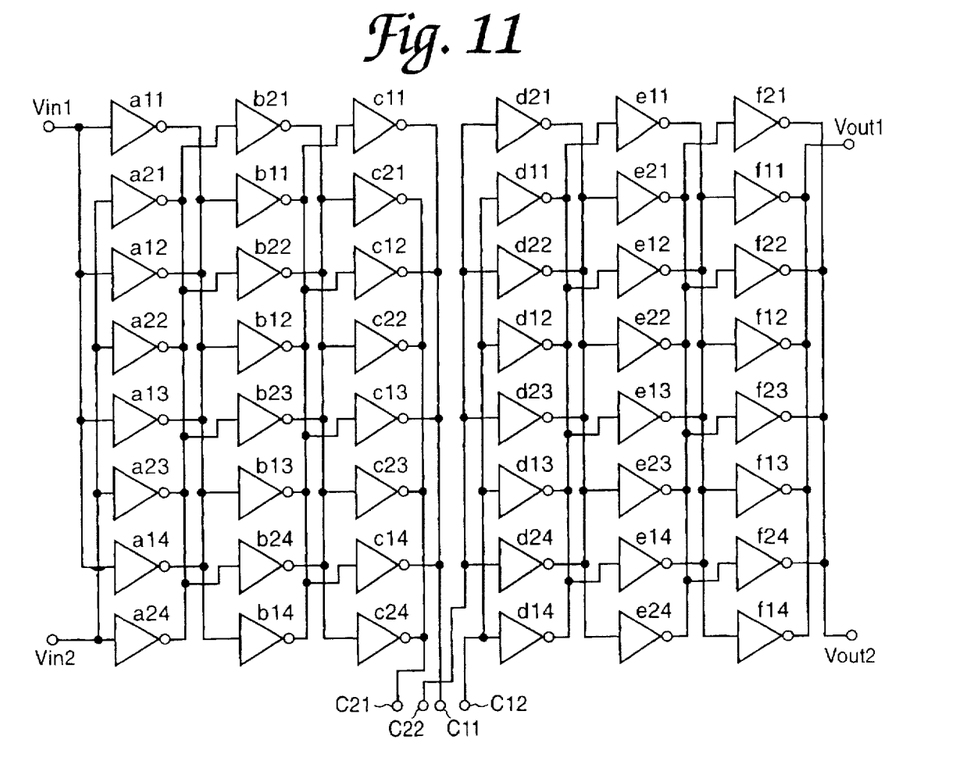
FIG. 11 shows a ground plan of a circuit of an arrangement of unit inverters for structuring two circuits in which two sets of inverter circuits with three stages are serially connected.
Figure 12:
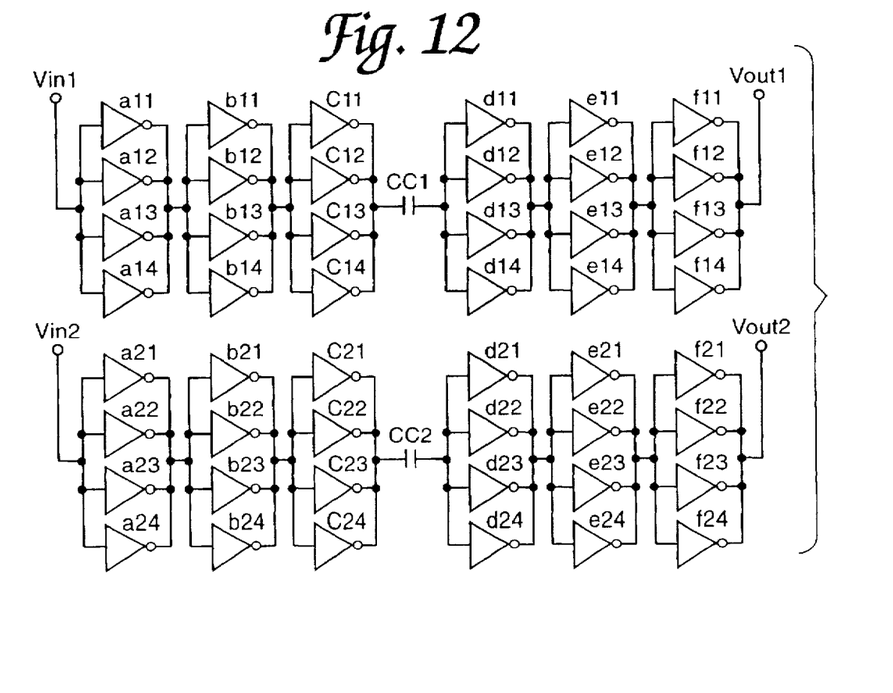
FIG. 12 shows an equivalent circuit in FIG. 11.

FIG. 11 shows an arrangement of unit inverters for constructing two sets of serial circuit systems each of which has two inverter circuits serially connected. Each inverter circuit includes three stages of inverters serially connected. FIG. 12 shows an equivalent circuit to the circuit depicted in FIG. 11. With respect to the first serial circuit system, the first stage of the inverter circuit consists of unit inverters a11, a12, a13 and a14 parallelly connected in the first inverter circuit. The second stage of inverters consists of parallel unit inverters b11, b12, b13 and b14, and the third stage of inverters consists of parallel unit inverters c11, c12, c13 and c14. In the second inverter circuit, the first stage consists of parallel unit inverters d11, d12, d13 and 14, the second stage of parallel unit inverters e11, e12, e13 and e14, and the third stage of parallel unit inverters f11, f12, f13 and f14. In the second system, an output of the first inverter of three stages is connected to the second inverter of three stage through a connecting capacitance CC1. The second system includes two sets of inverters of three stages serially connected. In the second serial circuit system, the first stage of the first inverter circuit consists of unit inverters a21, a22, a23 and a14 parallelly connected. The second stage consists of parallel unit inverters b21, b22, b23 and b24, the third stage consists of parallel unit inverters c21, c22, c23 and c24. In the second inverter circuit, the first stage consists of parallel unit inverters d21, d22, d23 and 24, the second stage of parallel unit inverters e21, e22, e23 and e24, and the third stage of parallel unit inverters f21, f22, f23 and f24. The first inverter of three stages is connected to the second inverter of three stages through a connecting capacitance CC2. In FIG. 11, the connecting capacitances are not shown but connecting terminals to connect the connecting capacitance CC1 and C11 and C12, and connecting terminals to connect the connecting capacitance CC2 of C21 and C22 are shown. Input and output terminals of the first system are Vin1 and Vin2, and input and output terminals of the second system are Vin2 and Vout2.

With respect to the arrangement for structuring the circuit depicted in FIG. 11, in an inverter circuit at the first stage of the first inverter of three stages, the unit inverters a11 to a14 and a21 to a24 of the first and the second systems are alternatively aligned, and corresponding unit inverters are adjacently position. As the inputs and outputs of a11 to a14 and a21 to a24 are parallelly connected, the characteristics variance is less than that of a single inverter. At the second stage, the order of the first system and the second system are inverted, and unit inverters of both systems are alternately aligned. That is, the unit inverters of the second system b21 to b24 and those of the first system b11 to b14 are alternately aligned, corresponding unit inverters are adjacently positioned, and a plurality of unit inverters are parallelly connected. At the third stage, the relationship of the inverters of the first and second system is the same as that of the first stage. Therefore, as a whole, the unit inverters of the first and the second systems are aligned in the checkerboard style. Similar effect can be obtained by the structure depicted in FIG. 10. In the second inverter of three stages, the unit inverters are aligned alternately and checkerboard style, the same as the first inverter of three stages. The characteristics of both systems is stable and the accuracy is improved similar to the first inverter of three stages.

Figure 13:
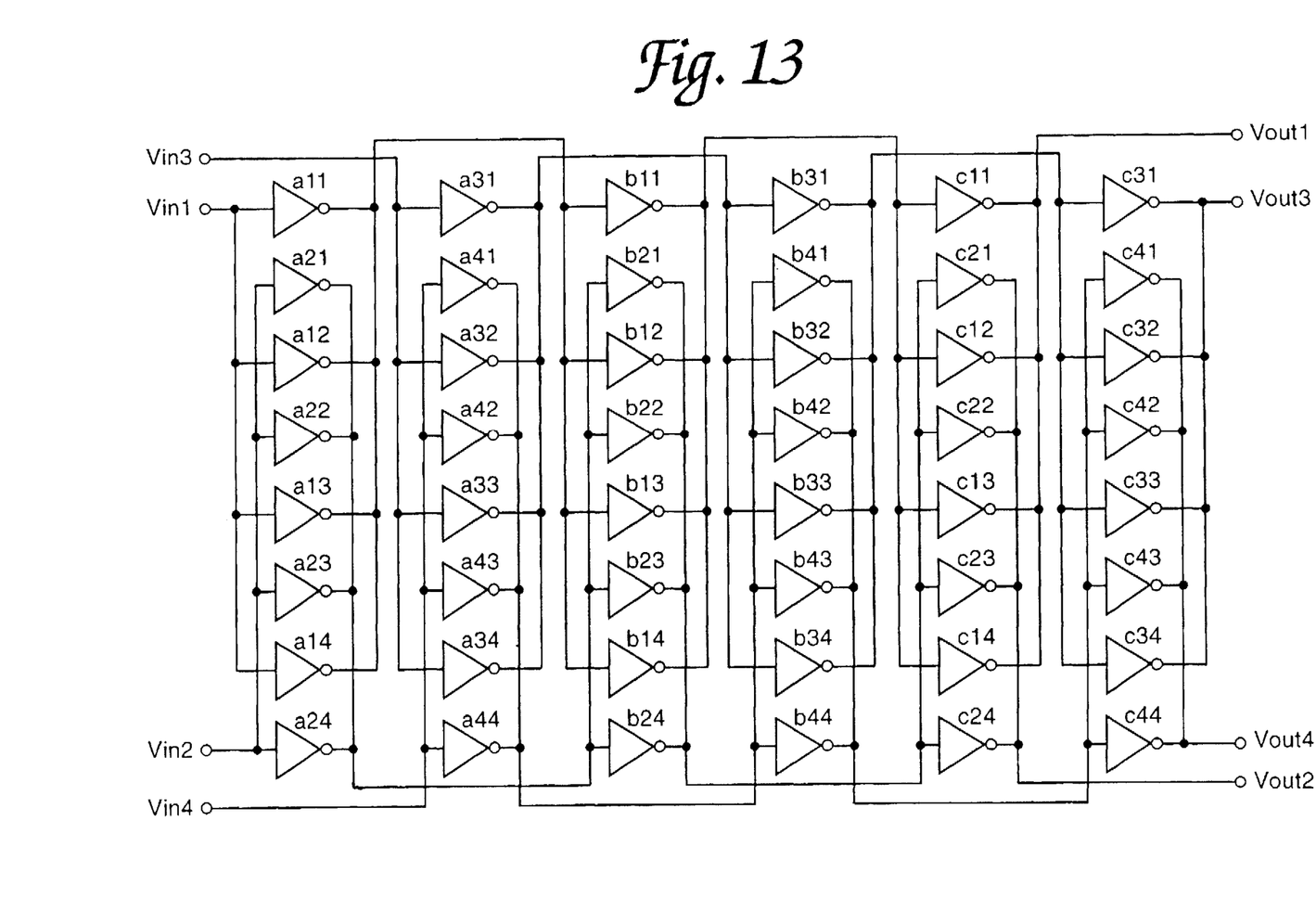
FIG. 13 shows a ground plan of a circuit showing the arrangement of unit inverters for structuring a four sets of inverter circuit with three stages.

FIG. 13 shows an arrangement of unit inverters for constructing four sets of three stages of inverters. In an equivalent circuit depicted in FIG. 14, the first system includes serially connected three stages which are i) the first stage of parallelly connected unit inverters a11, a12, a13 and a14, ii) the second stage of parallelly connected unit inverters b11, b12, b13 and b14, and iii) the third stage of parallelly connected unit inverters c11, c12, c13 and c14. The second system includes serially connected three stages which are i) the first stage of parallelly connected unit inverters a21, a22, a23 and a24, ii) the second stage of parallelly connected unit inverters b21, b22, b23 and b24, and iii) the third stage of parallelly connected unit inverters c21, c22, c23 and c24. The third system includes serially connected three stages which are i) the first stage of parallelly connected unit inverters a31, a32, a33 and a34, ii) the second stage of parallelly connected unit inverters b31, b32, b33 and b34, and iii) the third stage of parallelly connected unit inverters c31, c32, c33 and c34. The fourth system includes serially connected three stages which are i) the first stage of parallelly connected unit inverters a41, a42, a43 and a44, ii) the second stage of parallelly connected unit inverters b41, b42, b43 and b44, and iii) the third stage parallelly connected unit inverters c41, c42, c43 and c44. The input and output terminals of the first, second, third and fourth systems are Vin1, Vout1, Vin2, Vout2, Vin3, Vout3, Vin4 and Vout4, respectively.

Figure 14:
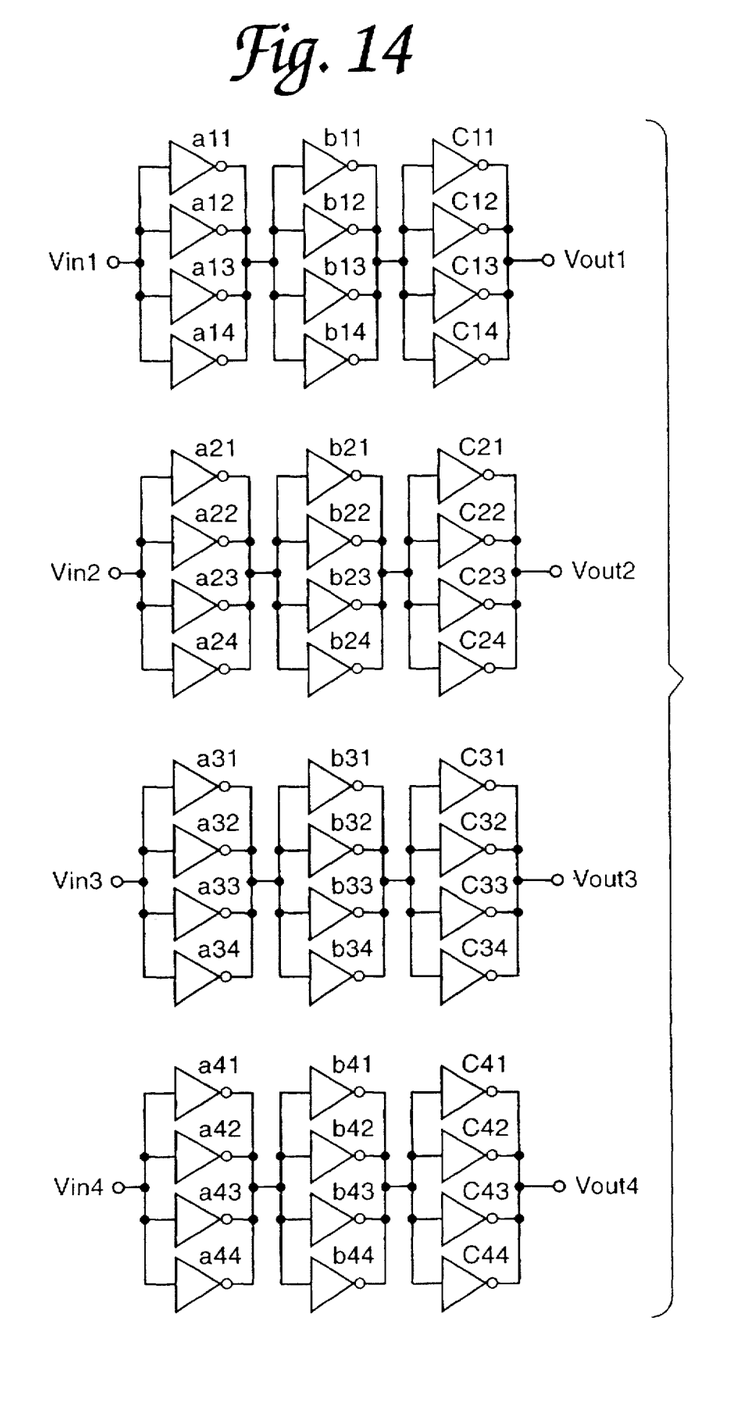
FIG. 14 shows an equivalent circuit in the circuit in FIG. 13.

With respect to the arrangement for structuring the circuit above in FIG. 14, in an inverter circuit at the first stage, the unit inverters a11 to a14 and a21 to a24 of the first and the second system are alternately aligned, and the unit inverters a31 to a34 and a41 to a44 of the third and the fourth system are alternately aligned. The rows of the first and second systems and the ones of the third and fourth systems are adjacently placed. Corresponding unit inverters, for example, a11, a21, a31 and a41, are adjacently placed in the vertical and horizontal directions. At the second and third stages, unit inverters are arranged similar to the first stage. As a whole, characteristics are uniformed by adjacently arranging corresponding unit inverters of different systems and the accuracy is improved by parallelly arranging a plurality of unit inverters.

As mentioned above, it is possible to realize an inverter circuit with a statistically stable function by absorbing the variance of each unit inverter by using a plurality of unit inverters parallelly connected, and also possible to uniform the characteristics of inverter circuits by adjacently arranging the corresponding unit inverters in different inverter circuits by the present invention. Consequently, the accuracy of the quantization in a quantizing circuit can be improved, and an A/D conversion with high accuracy can be obtained.

As described above, it is possible to stabilized the performance of the A/D conversion regardless of the characteristics variance of elements of the A/D converting circuit according to the present invention because the A/D converting circuit according to the present invention is structured by parallelly aligning a plurality of unit inverters.

What is claimed is:

1. An A/D converting circuit comprising:
   i) a first capacitance receiving an analog input voltage;
   ii) a first inverted amplifying portion connected to an output of said first capacitance, said first inverted amplifying portion having a range of linearity;
   iii) a first quantizing circuit receiving said analog input voltage and outputting a quantized output of said analog input voltage, said first quantizing circuit comprising a plurality of thresholding circuits corresponding to a plurality of threshold levels;
   iv) an output capacitive coupling receiving outputs from said first inverted amplifying portion and said first quantizing circuit;
   v) a second inverted amplifying portion receiving an output of said output capacitive coupling;
   vi) a second quantizing circuit receiving and quantizing an output of said second inverted amplifying portion, said second quantizing circuit comprising a plurality of thresholding circuits corresponding to a plurality of threshold levels; and
   vii) each of said thresholding circuits of said first and second quantizing circuits comprising:
      (a) a quantizing MOS inverter with a predetermined threshold and
      (b) a quantizing capacitive coupling having a plurality of parallel capacitances, said quantizing capacitive coupling receiving and adding said analog input voltage and inverted outputs of thresholding circuits with upper threshold levels, wherein said quantizing MOS inverter outputs a low level binary output when an output of said capacitive coupling exceeds said predetermined threshold and a high level binary output when said output of said capacitive coupling does not exceed said predetermined threshold, said first and second quantizing circuits being are provided with a higher supply voltage than a supply voltage of said quantizing MOS inverter, and each said quantizing MOS inverter comprising a plurality of unit inverters parallelly connected.

2. An A/D converting circuit as claimed in claim 1, wherein each of said unit inverters circuit comprises a CMOS inverter structured by serially connected pMOS type FET and nMOS type FET.

3. An A/D converting circuit as claimed in claim 1, wherein said unit inverters are adjacently aligned on an LSI substrate so that corresponding unit inverters of different said quantizing MOS inverters are adjacently positioned.

4. An A/D converting circuit as claimed in claim 1, further comprising refreshing means for short-circuiting inputs and outputs of said first and second inverted amplifying portions and of said quantizing MOS inverter, and for simultaneously inputting a plus voltage substantially equal to an ideal value of said predetermined thresholds of said quantizing MOS inverters.

* * * * *